United States Patent [19]
Berger et al.

[11] Patent Number: 5,780,916
[45] Date of Patent: Jul. 14, 1998

[54] ASYMMETRIC CONTACTED METAL-SEMICONDUCTOR-METAL PHOTODETECTORS

[75] Inventors: Paul R. Berger, Newark, Del.; Wei Gao, Woburn, Mass.

[73] Assignee: University of Delaware, Newark, Del.

[21] Appl. No.: 541,417

[22] Filed: Oct. 10, 1995

[51] Int. Cl.$^6$ .......................... H01L 21/095; H01L 29/47
[52] U.S. Cl. ........................ 257/471; 257/21; 257/97; 257/98; 257/431; 257/436; 257/449; 372/45; 372/46
[58] Field of Search ........................ 257/21, 20, 97, 257/98, 436, 451, 485, 497, 187, 192, 257, 458, 54, 47, 449, 457; 372/45, 96, 46, 99

[56] References Cited

U.S. PATENT DOCUMENTS

| | | | |
|---|---|---|---|
| 5,461,246 | 10/1995 | Chou | 257/449 |
| 5,568,499 | 10/1996 | Lear | 372/45 |

OTHER PUBLICATIONS

K. Kajiyama, et al., Schottky barrier height of n–In$_x$Ga$_{a-x}$As diodes, Appl. Phys. Lett., vol. 23, No. 8, 15 Oct. 1973.

D.V. Morgan, et al., Increasing the Effective Barrier Height of Schottky Contacts to n–In$_x$Ga$_{1-x}$As, Electronics Letters, 9$^{th}$ Nov. 1978, vol. 14, No. 23.

T. Tersoff, Recent models of Schottky barrier formation, J. Vac. Sci. Technol. B 3 (4), Jul./Aug. 1985.

J. B.D. Soole, et al., VIA–1 High–Speed Response of InAlAs/InGaAs M–S–M Photodetectors at 1.3–and 1.5–µm Wavelengths, IEEE Transactions on Electron Devices vol. 36, No. 11, Nov. 1989.

M. Zirngibl, et al., High sensitive an fast photodetectors at 820 nm, Helvetica Physica Acta, vol. 61 (1988).

H. Schumacher, et al., An Investigation of the Optoelectronic Response of GaAs/InGaAs MSM Photodetectors, Electron Device Letters, vol. 9, No. 11, Nov. 1988.

T. Kikuchi, et al., Ga$_{0.47}$In$_{0.53}$As Metal–Semiconductor–Metal Photodiodes Using A Lattice Mismatched Al$_{0.4}$Ga$_{0.6}$As Schottky Assist Layer, Electronics Letters, 15$^{th}$ Sep. 1988, vol. 24, No. 19.

W.C. Koscielniak, et al., Dynamic behavior of photocarriers in a GaAs metal–semiconductor–metal photodetector with sub–half–micron electrode pattern, Appl. Phys. Lett. 54(6), 6 Feb. 1989.

Won–Pyo Hong, et al., High–Performance Al$_{0.85}$Ga$_{0.85}$As/In$_{0.53}$Ga$_{0.47}$As MSM Photodetectors Grown By OMCVD, Transactions On Electron Devices, vol. 36, No. 4, Apr. 1989.

Long Yang, et al., GaInAs Metal/Semiconductor/Metal Photodetectors with Fe:InP Barrier Layers Grown By Chemical Beam Epitaxy, Electronics Letters 26$^{th}$ Oct. 1989, vol. 25, No. 22.

J.B.D. Soole, et al., High–Speed Performance of IMCVD Grown InAlAs/InGaAs MSM Photodetectors at 1.5 µm and 1.3 µm Wavlengths, IEEE Photonics Technology Letters, vol. 1, No. 8, Aug. 1989.

J.B.D. Soole, et al., High–speed metal–semiconductor–metal waveguide photodetector on InP, Appl. Phys. Lett. 55(21), 20 Nov. 1989.

(List continued on next page.)

Primary Examiner—Carl W. Whitehead
Attorney, Agent, or Firm—Connolly & Hutz

[57] ABSTRACT

A metal-semiconductor-metal (MSM) photodetector, specifically a new, improved low noise device is disclosed. The disclosed device is a MSM photodiode in which the cathode and anode are made of different materials with optimal Schottky barrier heights. One of these materials is chosen to provide a high ratio of Schottky barrier height to hole transport and the other to provide a high ratio of Schottky barrier height to electron transport. The disclosed MSM photodetector is designed to allow each Schottky barrier to be individually optimized to the point that a wide bandgap Schottky barrier enhancement layer and its associated heterointerface may become unnecessary. Elimination of the charge buildup at the heterointerface enhances carrier extraction resulting in photodetectors with elevated quantum efficiency and enhanced bandwidths.

35 Claims, 3 Drawing Sheets

OTHER PUBLICATIONS

Wiston K. Chan, et al., High–Speed $Ga_{0.47}In_{0.53}As$ MISIM Photodetectors with Dielectric–Assisted Schottky Barriers, IEEE Electron Device Letters, vol. 10, No. 8, Sep. 1989.

Robert B. Darling, et al., Epitaxial n+ Layer GaAs Mesa–Finger Interdigital Surface Photodetectors, IEEE Electron Device Letters, vol. 10, No. 10, Oct. 1989.

H.T. Griem, et al., Long–wavelength (1.0–1.6 μm) $In_{0.52}As/In_{0.53}(Ga_xAl_{1-x})_{0.47}As/In_{0.53}Ga_{0.47}As$ metal–semiconductor–metal photodetector, Appl. Phys. Lett. 56(11), 12 Mar. 1990.

D. Kuhl, et al., Very High–Speed Metal–Semiconductor–Metal in GaAs : Fe Photodetectors with InP : FeBarrier Enhancement Layer Grown by Low Pressure Metalorganic Chemical Vapour Deposition Electronics Letters, $6^{th}$ Dec. 1990, vol. 126, No. 25.

S. Loualiche et al., Pseudomorphic GaInP Schottky Diode and MSM Detector On InP, Electronics Letters, $29^{th}$ Mar. 1990, vol. 26, No. 7.

Julian B.D. Soole, et al., Transit–Time Limited Frequency Response of InGaAs MSM Photodetectors, IEEE Transactions on Electron Devices, vol. 37, No. 11, Nov. 1990.

A. Temmar, et al., AlInAs/GaInAs Metal–Semiconductor–Metal photodiodes with very low dark current, Microelectronic Engineering 15 (1991), pp. 267–270.

J.H. Burroughes, et al., 1.3 μm InGaAs MSM Photodetector with Abrupt InGaAs/AlInAs Interface, IEEE Photonics Technology Letters, vol. 3, No. 6, Jun. 1991.

G.–K. Chang, et al., A Novel Electronically Switched Four–Channel Receiver Using In AlAs–InGaAs MSM–HEMT Technology for Wavelength–Division–Multiplexing Systems, IEEE Photonics Technology Letters, vol. 3, No. 5, May 1991.

Yi–Chen, et al., 375–GHz–bandwidth photoconductive detector, Appl. Phy. Lett. 59 (16), 14 Oct. 1991.

Chang–Xin Shi, et al., High–Performance Undoped InP/n–$In_{0.53}Ga_{0.47}As$ MSM Photodetectors Grown by LP–MOVPE–IEEE Transactions on Electron Devices, vol. 39, No. 5, May 1992.

E. Sano, et al., Performance Dependence of InGaAs MSM Photodetectors on Barrier–Enhancement Layer Structure, Electronics Letters, $18^{th}$ Jun. 1992, vol. 28, No. 13.

Stephen Y. Chou, et al., Nanoscale Terra–Hertz Metal–Semiconductor–Metal Photodetectors, IEEE Journal of Quantum Electronics, vol. 28, No. 10, Oct. 1992.

M.V. Rao, et al., Metal–Semiconductor–Metal Photodetector Using Fe–Implanted $In_{0.53}Gs_{0.47}As$, Electronics Letters, $2^{nd}$ Jan. 1992, vol. 28, No. 1.

Jong–Wook Seo, et al., A Comparative Study of Metal–Semiconductor–Metal Photodetectors on GaAs with Indium–Tin–Oxide and Ti/Au Electrodes, IEEE Photonics Technology Letters, vol. 4, No. 8, Aug. 1992.

Jae H. Kim, et al., High–Performance Back–Illuminated InGaAs/InAlAs MSM Photodetector with a Record Responsive of 0.96 A/W, IEEE Photonics Technology Letters, vol. 4, No. 11, Nov. 1992.

F. Hieronymi, et al., High–Performance Large–Area InGaAs Metal–Semiconductor–Metal Photodetectors, IEEE Photonics Technology Letters, vol. 5, No. 8, Aug. 1993.

H.J. Lee, et al., Barrier height enhancement of Schottky diodes on n–$In_{0.53}Ga_{0.47}As$ by cryogenic process, Appl. Phys. Lett. 63(14), 4 Oct. 1993.

Y. Hirota, Schottky characteristic of GaAs surface cleaned by ultrasonic running deionized water treatment, Appl. Phys. Lett. 63 (14) 4 Oct. 1993.

P. Fay, et al., 15GHz monolithic MODFET–MSM integrated photoreceiver operating at 1.55 μm wavelength, Electronics Letters, $27^{th}$ Apr. 1995, Vo. 31, No. 9.

Paul R. Berger, et al., $In_{0.53}Ga_{0.47}As$ p–i–n photodiodes with transparent cadmium tin oxide contacts, Appl. Phys. Lett. 61(14), 5 Oct. 1992.

Wei Gao, et al., $In_{0.53}Ga_{0.47}As$ metal–semiconductor–metal photodiodes with transparent cadmium tin oxide Schottky contacts, Appl. Phys. Lett. 65 (15), 10 Oct. 1994.

Wei Gao, et al., Transparent and opaque Schottky contacts onundoped $In_{0.52}Al_{0.48}As$ grown by molecular beam epitaxy, Appl. Phys. Lett. 68 (25), 19 Jun. 1995.

M. Schulter, Theoretical Models of Schottky Barriers, Thin Solid Films, 93 (1982) 3–19.

ASYMMETRIC CONTACTED METAL-SEMICONDUCTOR-METAL PHOTODETECTORS

FIELD OF THE INVENTION

This invention relates to the field of metal-semiconductor-metal photodetectors, and more specifically to a new, improved low noise photodetector which utilizes an asymmetric contact arrangement to reduce leakage current.

DESCRIPTION OF THE PRIOR ART

Metal-semiconductor-metal photodetectors are generally known as high-speed photodetectors and have valuable uses in the fields of communications, research and photography, to name but some of many.

In brief, a metal-semiconductor-metal photodetector is a flat (planar) structure which has several layers. The "base" layer is a semiconductor layer which absorbs photons from a light source. Onto this layer are deposited metal electrodes.

The electrodes are "interdigitated", or alternating, and form Schottky contacts. A Schottky contact is generically defined as a contact point between a metal and a semiconductor, which contact forms a barrier layer at the contact interface. Generally, such contacts are extremely difficult to manufacture with a consistent barrier layer value.

Such photodetectors are known to be useful in optical communications systems, such as fiber-optic networks. Transmitted information is detected when incident light is absorbed by the semiconductor medium and the electron-hole pairs created are collected by the external circuit. For such a photodetector, and coupling of the photodetector with the fiber optic light source is greatly simplified by the large area and thin nature of the MSM semiconductor. Further, due to their interdigitated nature, electron and hole "pairs" have only a small distance to travel before encountering a conductor, yielding a rapid response time.

A conventional metal-semiconductor-metal photodetector is as illustrated in prior art FIG. 1.

A semi-insulating base or substrate 10 physically supports the structure and insulates the electrodes from each other and their surroundings. Active region 11 is the portion of the base wherein the photonic conversion to electrons and holes occurs. It may be a physically distinct region or the same as the base 10. Electrodes 12 are deposited onto the surface, and alternate between +and−electrodes in an interdigitated manner as illustrated.

FIG. 2 is a top view of the prior art photodetector of FIG. 1. Light is admitted in the spaces between the positive electrode 13 and the negative electrode 14. This narrow channel 15 limits the incident light entering the active region.

FIG. 3 is a theoretical diagram of the bandgap of an MSM photodetector. Electrodes 16 and 17 are deposited from the same metal and therefore have the same Schottky barrier height represented by arrows 18 and 19. These arrows represent the theoretical "jump" which must be made for a current to flow. Incident light 20 causes electrons 21 and holes 22 to form. They then migrate to the opposite pole electrodes. In this case, the electrode 16 is the negative electrode, while electrode 17 is the positive electrode.

A photodetector's effectiveness is measured by its performance in many different parameters. These parameters include dark current, responsivity, speed, and spectral range.

Dark current is generically defined as a current which flows in detectors when there is no radiant flux (light source) incident upon the electrodes. Or, in layman's terms, what is the current generated when there is total darkness. As an aside, this current may vary markedly between materials and temperatures.

Responsivity is the sensitivity of the photodetector, or a measure of how much incident light on the detector is collected and outputted as an external current. Conventional photodetectors are not very responsive, as the electrodes tend to shadow the "active" region of the semiconductor.

Speed of the detector is also a primary consideration. Metal-semiconductor-metal photodetectors have an inherently high speed, as the interdigitated spacing of the electrodes leads to a very low capacitance per unit area. In other words, the speed response is not limited by the resistance and capacitance product (RC time constant), but by the transit time of carriers from their creation point to the electrodes.

Last on the listed four physical qualities deemed most important is the spectral range of the response. As the range of electromagnetic radiation we call light extends from the infrared region (from 0.75 to 1000 microns in wavelength) to the ultraviolet (4000 angstroms to 400 angstroms), the more uniform the photodetector's response is over the spectral range, the better the detector it is.

Regardless of the cause, there has existed a problem surrounding MSM photodetectors in that they are inherently low on the responsivity end. As noted, the electrodes actually "shadow" the active area, and incident light needed to trigger a response is either reflected or absorbed without effect. An "ideal" metal-semiconductor-metal photodetector is reduced in efficiency by as much as 50% by this shadowing. Further, the reliability and reproducibility of a uniform Schottky contact has caused a lack of acceptance in the commercial arena.

DESCRIPTION OF THE PRIOR ART

MSM photodetectors have not entered general use because of their current characteristic defects noted above. However, many efforts have been made to improve them.

Varied types of materials have been used for the interdigitated "fingers"of the photodetectors to take advantage of the Schottky barrier effect, and different interlayers to take advantage of the variances produced on the contacting surface. The interlayer approach is illustrated in the bandgap illustration of FIG. 4.

Incident light 23 impinges upon the semiconductor active region 24 generating electrons 25 and holes 26. The interlayer 27, 28 is between the electrons and holes and the respective electrodes. This reduces the dark current, but creates a pile up of electrons at the heterointerface 29 and holes at heterointerface 30. This pile up presents resistance and interferes with responsivity.

In 1978 Morgan noted that a thin interfacial oxide layer could be used to increase the effective barrier height of Gold (Au) / Indium Phosphide (InP) and Au/ Indium Gallium Arsenide (InGaAs) Schottky contacts. This was said to be effective in reducing the leakage currents. However, the quality of the oxide varies immensely and results in a nonuniform contact.

Zirngibl et al reported in 1988 the use of a MSM photodetector with indium tin oxide metallization on chromium doped gallium arsenide. He was attempting to analyze their speed and sensitivity of response as a function of the layout geometry, and determined that high speed and responsivity could be accomplished for 820 nm incident light.

In 1988, Schumacher reported that the introduction of a non-lattice matched semiconductor could be inserted between the metallized fingers (Au, Platinum (Pt), or Titanium (Ti)) and the semiconductor layer (InGaAs) to decrease the dark current. The GaAs top layer was strained and the device as a whole was said to have a good speed response in the 8.5 GHz bandwidth.

Also in 1988, Kikuchi reported the use of an AlGaAs intermediate layer to increase the barrier heights, while Koscielniak reported on an investigation of the spacing between the fingers of the MSM detector as impacting on the response times in the 0.8–0.87 micrometer wavelength range. Parasitic elements dog this approach as the holes and electrons move through the semiconductor at speeds varying by as much as 40 times differential.

In 1989, Hong disclosed the enhancement of the Schottky barrier by using a thin layer of mismatched AlGaAs (Aluminum Gallium Arsenide) on an InGaAs semiconductor surface with Schottky photodiodes. He reported the decrease in dark leakage currents by as much as a factor of five. Yang disclosed the use of an Iron (Fe) doped InP cap layer to achieve a low dark current, and the speed was increased by narrowing the electrode gap, to a point. After that point, too much light was blocked. Soole disclosed the incorporation of a high quality lattice matched InAlAs barrier enhancement layer grown in place by organometallic chemical vapor deposition (OMCVD). The devices were said to have high speed and dark currents of 10–20 microamps over a 20 micrometer by 20 micrometer area with a 500 angstrom thick InAlAs barrier enhancement layer.

Soole also disclosed in 1989 the growth by OMCVD of a multilayer structure of undoped InP, then InGaAsP, InP, then InGaAs as the detector, and a strained layer of InGaAs to GaAs grading and GaAs for Schottky barrier enhancement. He noted that the device yields a small tail response—due most likely to the slower traveling holes to the electrodes and this slow motion is noted as a "significant limitation".

Chan in 1989 turned to a Langmuir-Blodgett film exposed to an oxygen plasma which dielectrically enhanced the Schottky barrier height and created a metal-insulator-semiconductor-insulator-metal (MISIM) photodetector. The photocurrent is said to be easily collected while reducing leakage current.

Darling recognized the limitation in 1989 that half of the incident optical power was lost due to surface reflection, and designed a "mesa" type detector with etched $n^+$ epitaxial layers as the collection electrodes. However, the dark current was found to increase exponentially with a biasing voltage.

In 1990, Griem disclosed the use of a graded quaternary layer of InAlAs/InGaAlAs(graded)/InGaAs to increase responsivity by 35%. Kuhl claimed a 100% internal quantum efficiency for his long-wavelength MSM photodetector using a InGaAs:Fe photoactive layer with an InP:Fe barrier enhancement layer.

Loualiche, in 1990, departed from the conventional wisdom somewhat and used a pseudomorphic ternary GaInP material with a high gap Schottky barrier. Soole directed his attention to the time response in that same year and analyzed a MSM InGaAs detector when illuminated with 1.55 micrometer wavelength light, and noted a tradeoff between speed and quantum efficiency.

In 1991, Temmar noted that a graded AlInAs/GaInAs MSM photodiode had a very low dark current (less than 1 nA at 10 V bias for 0.72 A/W). The grading is said to prevent carrier trapping at the interface. That same year, Burroughes took the opposite approach and designed an InGaAs MSM photodetector having an abrupt interface with AlInAs. The quality of the interface was used to reduce the leakage current, but discovered that charge storage at the abrupt interface occurs. Chen turned to the use of a low temperature (LT) grown GaAs photodetector which would give a high breakdown field and the electrodes could thus be narrowed to increase speed.

Different methods of growing the semiconductor layer were explored in 1992. Shi investigated an InGaAs MSM photodetector with an undoped InP barrier enhancement layer grown by low-pressure metal-organic vapor phase epitaxy. This was said to result in a very low dark current (60 nA for 100×100 micrometers area), high sensitivity and responsivity. The interdigitated electrodes were Au or Ti. The photodetector was said to be dopant and gradient free.

Sano explored the advantages of a graded superlattice over an InGaAs absorption layer. This was said to reduce the band discontinuity and charge pileup. Chou determined that, as technology advanced and finger spacing could be reduced to nanometers, the speed and sensitivity would be increased because of reduced transit time of the electrons and holes and lower capacitance. He produced nanoscale terahertz MSM photodetectors on bulk, LT-GaAs, and crystalline Si by electron beam lithography and lift-off. These photodetectors were claimed to be the fastest yet developed.

Rao used, also in 1992, a two-finger interdigitated MSM detector having high-resistance Fe-implanted InGaAs grown on InP:Fe by MOCVD. The Fe implantation was carried out by selective area ion implantation to yield a photodetector which was said to be highly responsive with a low dark current.

Seo took the approach of using a transparent indium tin oxide (ITO) photodetector on GaAs. The breakdown voltage was said to be much higher due to the uniformity of the metallurgical contact between ITO and GaAs. Kim attempted to back-illuminate InGaAs/InAlAs/InP MSM detectors. This was said to have a 45–50% increase in responsivity.

1993 brought an attempt by Hieronymi to make a large-area InGaAs MSM photodetector (having a 350 by 350 micron area). The electrodes were palladium/gold, and the dark current was said to be 20 pA. Lee enhanced the barrier height of Schottky contacts by using a cryogenic processing technique. Hirota attempted to clean the surface with ultrasonic deionized running water to effect the barrier height.

The present inventor's earlier work (Berger et al., "$In_{0.53}Ga_{0.47}$ As p-i-n photodiodes with transparent cadmium tin oxide contacts", Appl. Phys. Lett. 61 (14) 5 Oct. 1992, p. 1673, involved the development of a new type of p-i-n InGaAs photodiode having an optically transparent composite top electrode with a thin semitransparent metal layer and a transparent Cadmium (Cd) Tin Oxide (CTO) layer. An antireflection coating with these electrodes was said to increase the collection of incident light. This also was disclosed in U.S. Pat. No. 5,212,395. Gao et al. $In_{0.53}Ga_{0.47}$ As metal-semiconductor-metal photodiodes with transparent cadmium tin oxide contacts", Appl. Phys. Lett. 65 (15), 10 Oct. 1994, p. 1930, applied this idea to MSM photodiodes.

All of this prior art has the same characteristic: MSM photodetectors employ back-to-back Schottky diodes using the same metal for both contacts. This creates the problem where the Schottky barrier heights (hole and electron) are restricted by the bandgap of the semiconductor.

SUMMARY OF THE INVENTION

While imaginative, each of the foregoing attempts does not recognize a fundamental advantage can be gained by using two different metal contacts to make the cathode and the anode. By appropriate selection of the cathode/anode materials, the dark current may be manipulated.

More specifically, in a preferred embodiment, one metal electrode can be chosen which has a high electron Schottky barrier height, while the other electrode can be chosen to have a high hole Schottky barrier height. The leakage current can be attenuated, thereby improving the noise figure.

The prior art interdigitated electrodes have heretofore been formed by a single photolithography step and successive metal evaporation, which inexpensively results in a cathode-anode structure in which the metal is the same.

As recognized in the prior art, GaAs is useful for the production of photodetectors with sensitivity in the 0.8 micrometer wavelength region (suitable for local area networks). They do not suffer from an excessive dark current because, assuming the contacts are sufficiently well made, the barrier height is 0.8 eV.

The above cited prior art has also recognized that InGaAs is more useful for the longer-range communications, i.e. fiber optics due to its sensitivity at the 1.3 to 1.55 micrometer wavelengths which is the range of least attenuation for long-haul fibers. The excessive dark current leakage is prevalent in these materials due to the very low Schottky barrier height of about 0.19 eV. As standard MSM photodetectors are comprised of back-to-back Schottky barriers, one side acts as a barrier to back injection of holes, while the other side acts as a barrier to electron injection.

$$E_g = \Phi_{B_n} \Phi_{B_p}$$

For a MSM photodiode, the dark current is controlled by the lowest Schottky barrier height. Thus, the prior art was only capable of achieving a barrier height of about mid bandgap. For the newer long wavelength receptive materials, such as InGaAs, this is insufficient. A solution (urgently needed) is provided by the instant invention.

Figure 4:
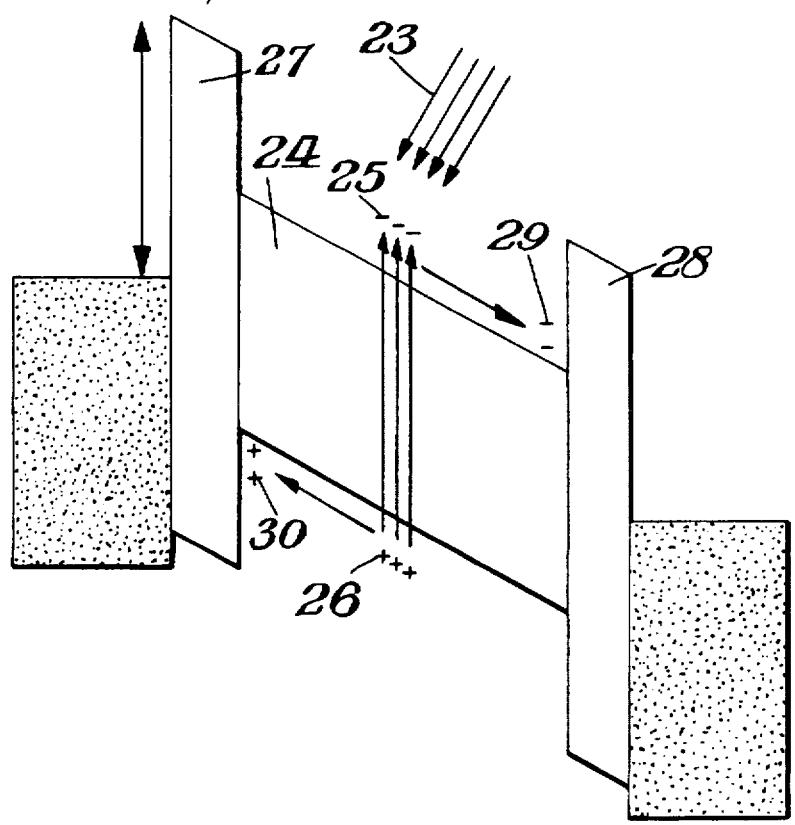

FIG. 4, as discussed above, is a diagrammatic representation of the theoretical bandgap of an MSM photodetector with an interlayer leading to charge pile up at each heterointerface.

Figure 4A:
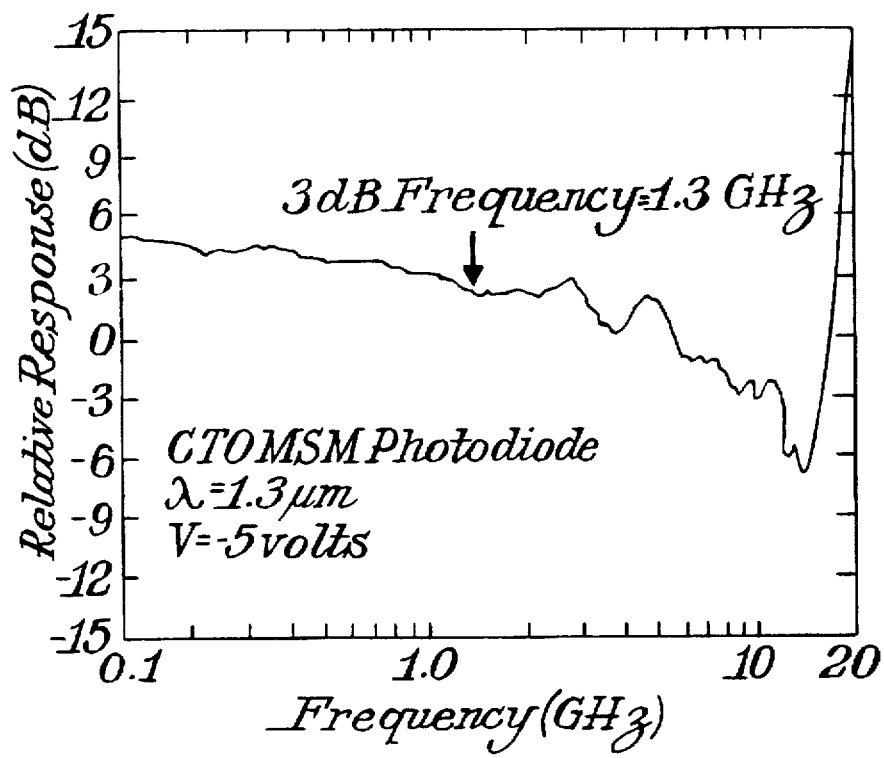

FIG. 4a is a chart illustrating the bandwidth of an InGaAs MSM photodiode with Ti/Au electrodes utilizing a graded heterojunction.

Figure 4B:
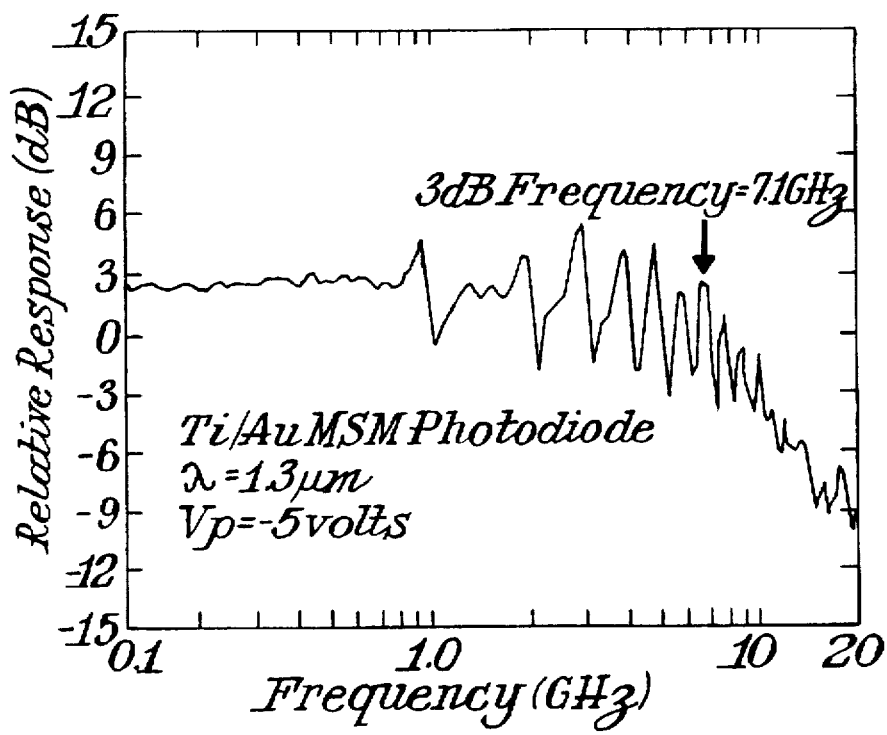

FIG. 4b is a chart illustrating the bandwidth of an InGaAs MSM photodiode with CTO electrodes utilizing a graded heterojunction.

Figure 1:
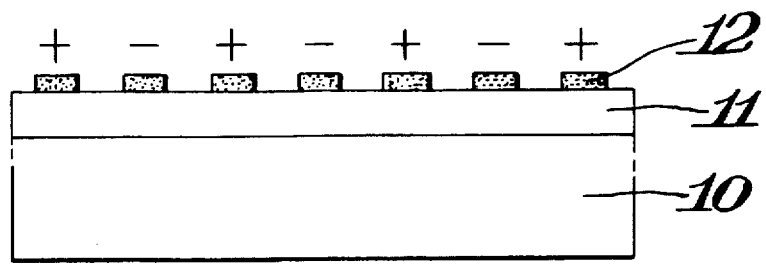
FIG. 1 is a side view diagrammatic illustration of an MSM photodetector of the prior art.
Figure 2:
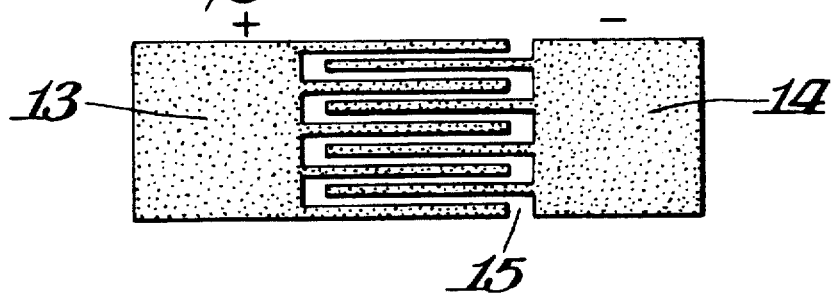
FIG. 2 is a top view diagrammatic illustration of an MSM photodetector of the prior art.
Figure 5:
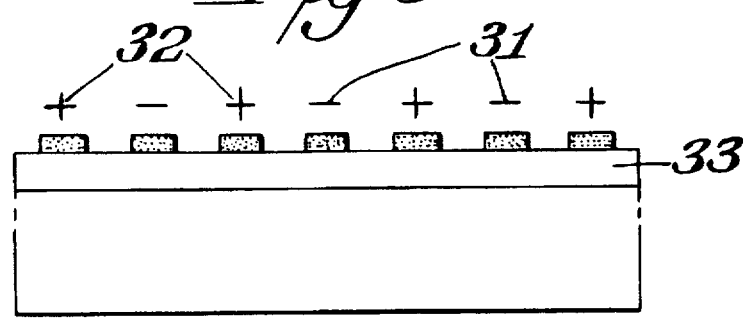

FIG. 5 is a side view of an asymmetric photodetector according to the present invention.

Figure 6:
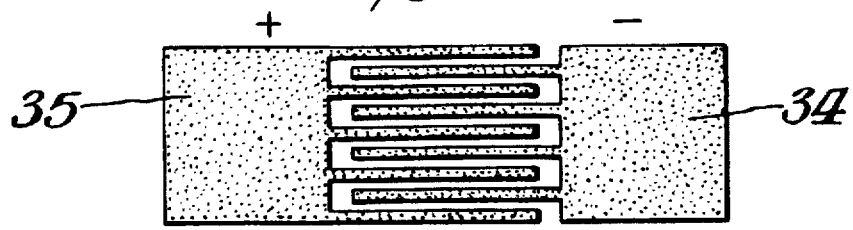
Figure 3:
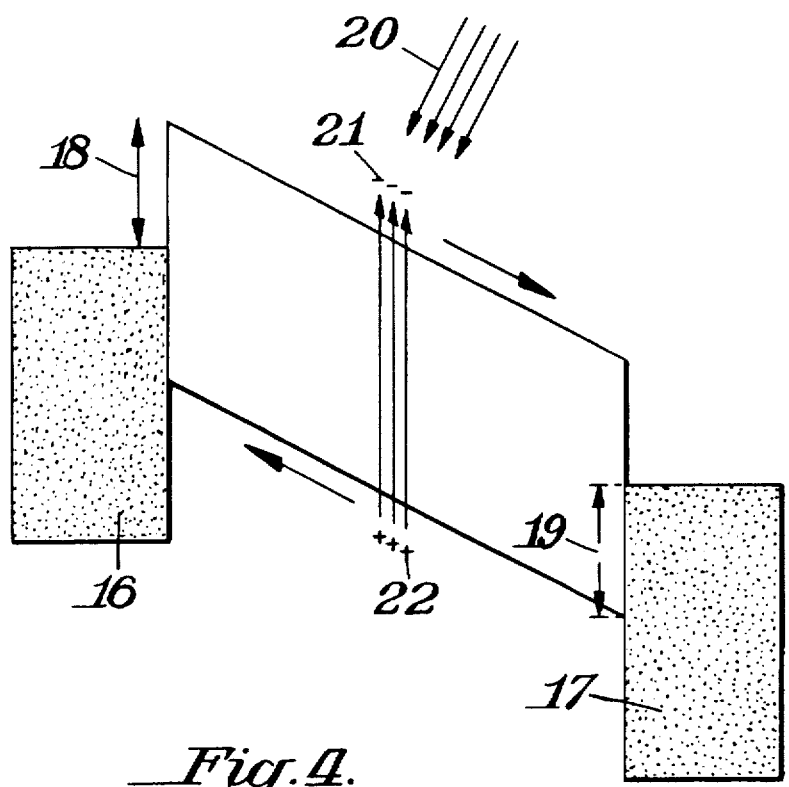
FIG. 3 is a theoretical illustration of the bandgap of a symmetric MSM photodetector, i.e. one which is made of the same metal. Since the same metal is used for the contacts, the lowest Schottky barrier dominates the leakage current, as shown by the formula.

FIG. 6 is a top plan view of an asymmetric photodetector according to the instant invention.

As noted above in the cited prior art, attempts have been made to interpose an interlayer to act as barrier enhancement. However, these methods have the drawback of a slower response because of the several interfaces, and a pile up of carriers at the heterointerface.

Applicants can utilize different metallic components for the electrodes to optimize the barrier height independently for the electrons and the holes. Thus, applicants can seemingly violate the principle that the barriers must add up to the bandgap. In fact, they need not.

As illustrated in FIG. 5, the electrodes are formed of different materials. The negative electrodes 31 are formed from a first metal, while the positive electrodes are formed from a second metal. Each different metal is deposited upon active layer 33 in a different photolithography step.

FIG. 6 shows negative electrode 34 of one metal, and positive electrode 35 of a second metal.

The metals used may be selected from such "pure" metals as Titanium (Ti), Gold (Au), Platinum (Pt), Nickel (Ni), Chromium (Cr), Aluminum (Al) or Silver (Ag). These metals may be essentially pure, or alloyed with other metals. Nickel-chromium (NiCr) is one such suitable alloy. Suitable oxides of these metals may also be used, and those may be selected by one of skill in the art having regard for the present disclosure. Transparent conductors may also be used, among them Indium Oxide, Cadmium Oxide, Indium Tin Oxide, or related oxides. Among the other suitable conductive compounds are refractory metals, such as Molybdenum (Mo), Tantalum (Ta), Tungsten (W), or other suitable metals selectable by those of skill in the art having regard for this disclosure.

Silicides may be utilized, and this enables the artisan to select from a whole host of possible conductors to use as the electrodes in an MSM photodetector according to the instant invention.

Nitrides may also be suitable for use in the applications of the present invention. For example, titanium nitride has suitable conducting properties, and others suitable within the scope of this invention may be selected.

Metals with different work functions are chosen with different electron and hole Schottky barrier heights.

This approach is completely novel. As a normal matter of practical experience, metals used as Schottky contacts have a fixed Fermi level, regardless of metal work function. However, an additional step of passivating the surface of the semiconductor with a sulfide based solution or plasma will give an "ideal" metal-semiconductor contact and enable the invention to be realized to its full potential. Alternative methods include the use of a thin counter-doped surface layer which would raise a single barrier height. This would act to artificially raise one of the barrier heights.

A different approach is to grow a thin p$^+$ layer on top of an n-type absorption layer. By having this layer between one of the electrodes and etching the thin layer away below the other electrode, the Schottky barrier height is manipulated.

A photodetector according to the instant invention will have several advantages over prior art photodetectors. First, a Schottky barrier enhancement layer separately applied or grown is not necessary, eliminating the need of a reduction in sensitivity and response. Further, the problem of pile-up and the countervoltage thus induced are eliminated.

Experimental results utilizing an interlayer indicate that there is still a slower response time, and the bandwidth is seriously impaired. CTO and Ti/Au MSM photodiodes using abrupt barrier enhancement structures demonstrated a 3-dB bandwidth of 0.3 and 0.8 GHz, respectively, when measured with a Cascade probe station with coplanar probes and an HP 8703 Lightwave Analyzer with a 1.3 μm externally modulated laser diode which was butt coupled to the detectors via a single mode optical fiber.

However, when a graded junction is employed, better carrier extraction is achieved resulting in increased bandwidths of 1.3 and 7.1 GHz, respectively, for Ti/Au and CTO as may be seen by FIGS. 4a and 4b, respectively. The present invention goes one step further, by obviating the need for any interlayer at all and completely avoiding the drawbacks of the heterolayer.

The production of an MSM photodetector according to the instant invention is preferably done by cleaving the semiconductor wafer under a vacuum, or performing the epitaxial growth of the active layer under a vacuum, and maintaining the vacuum while depositing the different metals. This avoids irregular oxidation which greatly effects the Schottky barrier height.

A photodetector according to the instant invention is also more compatible with the existing field effect transistor technology than an additional InAlAs type barrier enhancement structure. Finally, the lowest Schottky barrier which controls leakage is now able to be greater than mid bandgap, allowing for an extremely low leakage current.

A particularly preferred MSM photodiode for use in long distance communications (i.e. 1.30 to 1.55 micrometer wavelength) is as follows. First, the photodiode contains as an active medium InGaAs or InGaAsP.

The photodiode also contains an InP Schottky barrier enhancement layer which is lattice matched. Such a barrier enhancement layer avoids deep levels and impurities associated with aluminum containing compounds. The barrier enhancement layer is preferably graded. Specifically, the active region to the cap layer (InP) is graded to avoid an abrupt heterojunction and the consequential pile up of carrier. This avoids the subsequent weakening of applied bias level and slower response.

Such a preferred photodiode is favorably grown epitaxially on a semi-insulating Fe-doped (or undoped) InP layer which avoids stray capacitances and the subsequent loss in response. Stray capacitances can be created by the photodiode active region and associated metallizations and a highly doped substrate.

An undoped buffer layer is preferably provided to keep impurities from diffusing into the active region from the lower quality substrate material.

The photodiode is preferably fabricated as a "mesa" etched type structure which is physically and electrically isolated from the surrounding structure. This avoids the capacitance problems discussed above and also avoids collection of light in low field areas which contribute to a phenomenon called "slow tail" response, which is the delayed generation of current from more distant regions.

Passivation of the mesa sidewalls with a dielectric material such as silicon dioxide or silicon nitride is preferable and acts to reduce surface leakage current along the mesa sidewalls. It also allows for larger bonding pads to be placed off the mesa, avoiding damage to the photodiode active region when the bonding process is undertaken.

The active region is preferably between 0.5 to 1.50 micrometers thick to ensure maximum reasonable light collection while avoiding collection deep below or distant from the electrodes where the electric field lines tail off. The penetration depth of 1.3 micrometer light is 0.86 microns and for 1.55 micrometer light it is 1.47 microns.

The electrode spacing and widths are preferably of submicron dimensions (i.e. less than 1 micron). This further reduces the transit time of carriers to the electrodes. The most optimal spacing and width is 300 nanometers. Thickness of the electrodes should be at least 50–100 angstroms, and these thin electrodes are optionally overlaid with a high conductance low resistance metal such as gold to achieve a final thickness of 1000–5000 angstroms during the metallization phase of the photodiode manufacturing.

An antireflection coating is preferably provided to reduce the loss of incident light due to surface reflections due to the change in the index of refraction. Optionally, a reflective coating is provided at one surface, and the photodiode can be backlit for a "double pass" which allows light not collected on the first pass to be reflected and collected again.

Most preferably, the MSM photodiode is at least 100 square micrometers, but exceptionally preferred are about 2,500 to 10,000 square micrometers which facilitates coupling of fiber optic cables to the detector.

Having thus described the invention as above, We claim:

1. A photodetector comprising:
   a semiconductor substrate having an active region on one surface thereof,
   a first set of electrodes deposited on the active region of the substrate made from a first material,
   a second set of electrodes deposited on the active region of the substrate made of a second material, wherein the first set and second set of electrodes are made of different metals having different Schottky barrier heights.

2. A photodectector as claimed in claim 1, wherein the active region of the substrate is InGaAs, InGaAsP, or GaAs.

3. A photodetector as claimed in claim 1, wherein the photodetector includes a barrier enhancement layer.

4. A photodetector as claimed in claim 3, wherein the barrier enhancement layer comprises lattice matched InP.

5. A photodetector as claimed in claim 3, wherein the transition from the substrate to the barrier enhancement layer is graded.

6. A photodetector as claimed in claim 3, wherein an undoped buffer layer is interposed between the substrate and active region.

7. A photodetector as claimed in claim 3, wherein the substrate is an Fe-doped InP.

8. A photodetector as claimed in claim 3, wherein the substrate is an undoped InP.

9. A photodetector as claimed in claim 1, wherein the photodetector is electrically isolated from surrounding structures.

10. A photodetector as claimed in claim 9, wherein the electrical isolation is accomplished by etching the photodiode down to the substrate to form a mesa.

11. A photodetector as claimed in claim 10, wherein the mesa has sidewalls which are passivated with a dielectric material.

12. A photodetector as claimed in claim 11, wherein the dielectric material is silicon dioxide or silicon nitride.

13. A photodetector as claimed in claim 1, wherein the photodiode has an active region from 0.5 to 1.00 micrometers thick.

14. A photodetector as claimed in claim 1, wherein the electrodes are spaced apart by less than 1 micron.

15. A photodetector as claimed in claim 1, wherein the electrodes are spaced apart by about 300 nm.

16. A photodetector as claimed in claim 1, wherein a portion of the electrodes are about 1 micron wide.

17. A photodetector as claimed in claim 1, wherein a portion of the electrodes are less than 1 micron wide.

18. A photodetector as claimed in claim 1, wherein a portion of the electrodes are 300 micrometers wide.

19. A photodetector as claimed in claim 1, wherein at least one metal is opaque.

20. A photodetector as claimed in claim 1, wherein the photodetector is at least 100 square micrometers in area.

21. A photodetector as claimed in claim 1, wherein the photodetector is from about 100 to about 10,000 square micrometers in area.

22. A photodetector as claimed in claim 1, wherein the photodetector is from about 2,500 to about 10,000 square micrometers in area.

23. A photodetector as claimed in claim 1, wherein at least one electrode is 50–100 angstroms thick.

24. A photodetector as claimed in claim 1, wherein at least one electrode is overlaid with a low resistance metal.

25. A photodetector as claimed in claim 1, wherein at least one electrode has a total thickness of 1000–5000 angstroms.

26. A photodetector as claimed in claim 24, wherein the metal is gold.

27. A photodetector as claimed in claim 1, further comprising an anti-reflective coating on the active region of the substrate surface.

28. A photodetector as claimed in claim 1, further comprising a reflective coating on at least one surface of the substrate other than the active region.

29. A photodetector as claimed in claim 1, wherein one electrode material is Ti, Ag, Pt, Ni, Cr, Al, or Ag.

30. A photodetector as claimed in claim 1, wherein one electrode material is a refractory metal.

31. A photodetector as claimed in claim 1, wherein one electrode material is Mo, Ta, or W.

32. A photodetector as claimed in claim 1, wherein one electrode material is a silicide.

33. A photodetector as claimed in claim 1, wherein one electrode material is a transparent conductor.

34. A photodetector as claimed in claim 1, wherein one electrode material is indium oxide, cadmium oxide, or indium tin oxide.

35. The photodetector of claim 1 which is a metal-semiconductor-metal photodetector.

* * * * *